United States Patent
Chen et al.

(10) Patent No.: US 7,362,585 B2
(45) Date of Patent: Apr. 22, 2008

(54) FRAME FOR A DEVICE MOUNTED ABOVE A PRINTED CIRCUIT BOARD IN AN ELECTRONIC DEVICE

(75) Inventors: Chao Chen, Waterloo (CA); Tim Kyowski, Brantford (CA); Jason Griffin, Kitchener (CA)

(73) Assignee: Research in Motion Limited, Waterloo, Ontario (CA)

( * ) Notice: Subject to any disclaimer, the term of this patent is extended or adjusted under 35 U.S.C. 154(b) by 171 days.

(21) Appl. No.: 11/055,083

(22) Filed: Feb. 11, 2005

(65) Prior Publication Data

US 2006/0181841 A1    Aug. 17, 2006

(51) Int. Cl.
*H05K 7/00* (2006.01)
(52) U.S. Cl. .................... 361/729; 361/807
(58) Field of Classification Search ............. 361/729, 361/807, 810, 816, 818
See application file for complete search history.

(56) References Cited

U.S. PATENT DOCUMENTS

| 6,108,213 | A | * | 8/2000 | Yamamoto et al. | 361/784 |
| 6,304,458 | B1 | | 10/2001 | Mendolia | |
| 6,600,663 | B1 | * | 7/2003 | Koleda | 361/816 |
| 6,624,432 | B1 | * | 9/2003 | Gabower et al. | 250/515.1 |
| 2003/0161093 | A1 | * | 8/2003 | Lam et al. | 361/681 |
| 2004/0057218 | A1 | | 3/2004 | Wu et al. | |
| 2005/0111194 | A1 | * | 5/2005 | Sohn | 361/704 |

FOREIGN PATENT DOCUMENTS

| EP | 1 001 304 A2 | | 5/2000 |
| JP | 1001304 | * | 5/2000 |
| WO | WO-2004/040949 A1 | | 5/2004 |

* cited by examiner

*Primary Examiner*—Tuan T. Dinh
*Assistant Examiner*—Yuriy Semenenko
(74) *Attorney, Agent, or Firm*—McCarthy Tétrault LLP

(57) ABSTRACT

The invention provides a frame for mounting a device above a printed circuit board (PCB) in an electronic device. The frame comprises: a frame section formed to be located on the PCB about a surface device on a section of the PCB; and a cover for placement on top of the frame section and for providing a support substrate for the device. In the frame, the frame section is securable to the PCB above at least a part of the surface device; the cover is locatable on the frame section with the device mounted to the cover; and the cover is shaped to allow a feature on the bottom of the device to extend downward towards an interior cavity of the frame.

16 Claims, 8 Drawing Sheets

FRAME FOR A DEVICE MOUNTED ABOVE A PRINTED CIRCUIT BOARD IN AN ELECTRONIC DEVICE

FIELD OF INVENTION

The invention relates to a frame for a device (such as a display) for an electronic device (such as a portable communication device), in particular, the invention relates to a display frame mountable on a printed circuit board (PCB) of a communication device, which provides electrical shielding to components located underneath the frame.

BACKGROUND

In an electronic device, such as a portable phone, a display is invariably part of the device. Software operating on the device controls the display to selectively show information to the user, such as the current time, caller ID, pictures and battery level. Typically, a large display is installed in order to provide larger and clearer pictures, text and indicators to the user. It is common for a display to be directly mounted to a top housing portion of the device leaving the bottom surface of the display suspended above a printed circuit board located inside the housing of the device. However, devices such as portable phones continue to decrease in size, the overall size of the housing is shrinking and the distance between the bottom of the display and the top of the PCB decreases. This smaller space impinges on the ability to place components on the area of the PCB directly underneath the display.

There is a need to have a system for mounting a component of an electronic device (such as a display for a portable phone), which addresses deficiencies in the prior art.

SUMMARY

In a first aspect, a frame for mounting a device above a printed circuit board (PCB) in an electronic device is provided. The frame comprises: a frame section formed to be located on the PCB about a surface device on a section of the PCB; and a cover for placement on top of the frame section and for providing a support substrate for the device. In the frame, the frame section is securable to the PCB above at least a part of the surface device; the cover is locatable on the frame section with the device mounted to the cover; and the cover is shaped to allow a feature on the bottom of the device to extend downward towards an interior cavity of the frame.

In the frame, the cover and the frame section may be comprised of an electrically conductive material such that the cover and the frame provide an electrical contact for the device to a ground plane on the PCB and provide an electric shield to the surface device.

In the frame, the device may be a display device; and the cover may have an electrically conductive flange extending upward to contact a bottom of the device.

In the frame, the frame device may have a first post which interacts with the PCB to secure the frame to the PCB; and the cover may have a second post which interacts with the first post to secure the cover to the frame.

In the frame, the feature extending from the bottom of the device may be placed in a location which is not above the surface device.

In a second aspect, a printed circuit board (PCB) assembly for an electronic device is provided. The assembly comprises: a PCB having a surface device mounted on a section of the PCB; a frame section formed to be located on the PCB above the surface device; a cover for placement on top of the frame section; and a device mounted on the cover. In the assembly, when the frame section is secured to the PCB about the surface device and the cover is located on the frame section and the device is mounted to the cover, the surface component is located at least partially underneath the cover.

In the assembly, both the cover and the frame section may be comprised of an electrically conductive material such that the cover and the frame provide an electrical contact for the device to a ground plane on the PCB.

In the assembly, the device may be a display device; and the cover may have at least one electrically conductive flange extending upward to contact a bottom of the device.

In the assembly, the frame may have a first post which interacts with the PCB to secure the frame to the PCB, and the cover may have a second post which interacts with the first post to secure the cover to the frame.

In the assembly, the cover may be shaped to allow a feature on the bottom of the device to extend downward towards an interior cavity of the frame.

In the assembly, the feature extending from the bottom of the device may be placed in a location which is not above the surface component.

In other aspects various combinations of sets and subsets of the above aspects are provided.

BRIEF DESCRIPTION OF DRAWINGS

The foregoing and other aspects of the invention will become more apparent from the following description of specific embodiments thereof and the accompanying drawings which illustrate, by way of example only, the principles of the invention. In the drawings, where like elements feature like reference numerals (and wherein individual elements bear unique alphabetical suffixes).

DETAILED DESCRIPTION OF AN EMBODIMENT

Figure 1:
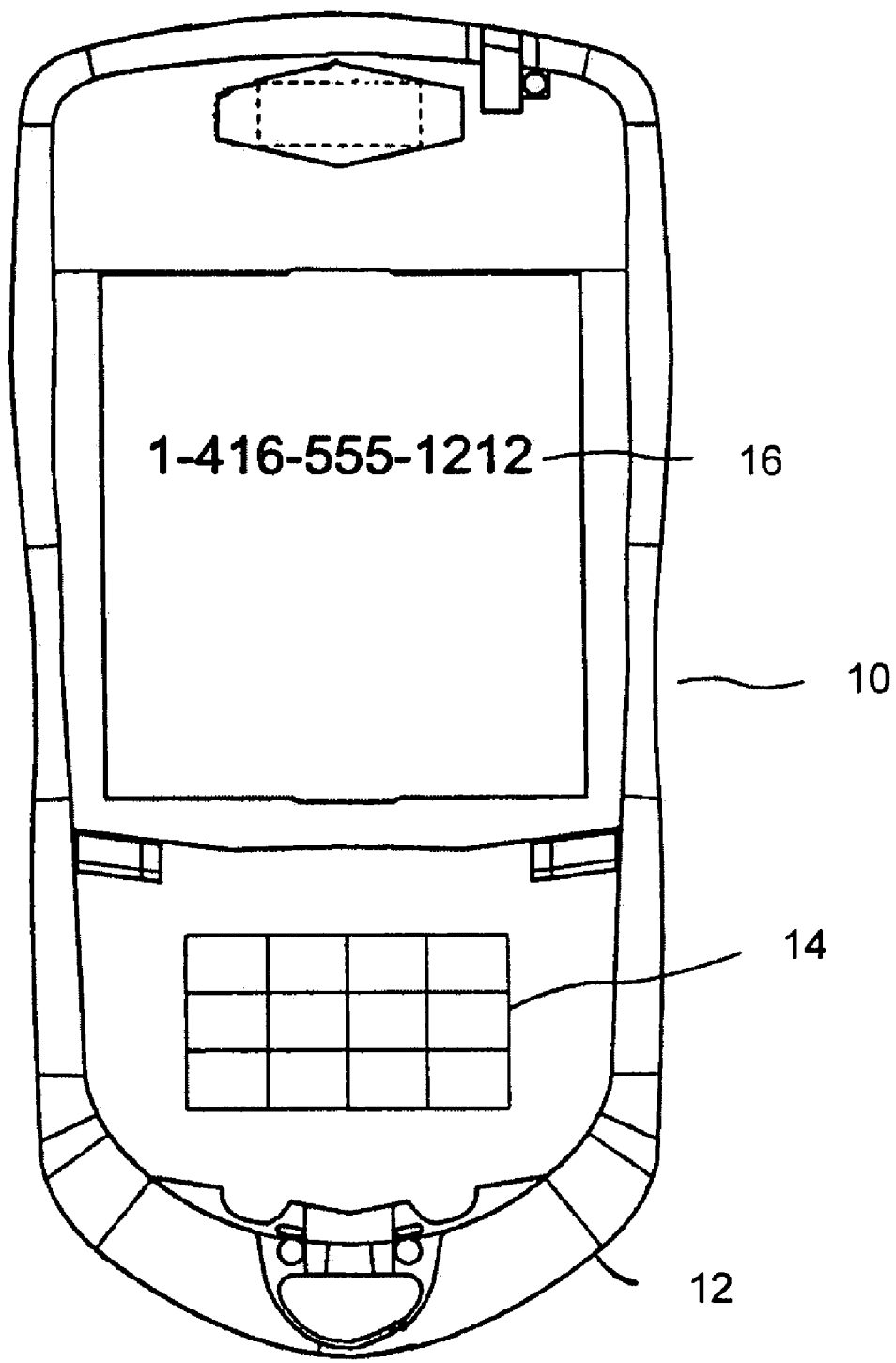
FIG. 1 is a front view of a communication device having a display internally mounted to a display frame relating to an embodiment.

The description which follows, and the embodiments described therein, are provided by way of illustration of an example, or examples, of particular embodiments of the principles of the present invention. These examples are provided for the purposes of explanation, and not limitation, of those principles and of the invention. In the description, which follows, like parts are marked throughout the specification and the drawings with the same respective reference numerals.

FIG. 1 schematically illustrates a handheld mobile communication device 10 and its components, including a housing 12, an input device (e.g. keyboard 14) and an output device (a display 16), which is preferably a graphic Liquid Crystal Display (LCD), although other types of output devices may alternatively be utilized. Typically, housing 12 is a molded polycarbonate structure and may be formed via known plastic injection moulding techniques. To assist in assembly of device 10, housing 12 typically comprises two or more pieces which fit together in a fitted arrangement to enclose the internal devices and form an exterior casing for device 10. For example, housing 12 may comprise an upper housing and a lower housing. Physically for device 10, housing 12 may be elongated vertically, or may take on other sizes and shapes (including clamshell housing structures).

Figure 2:
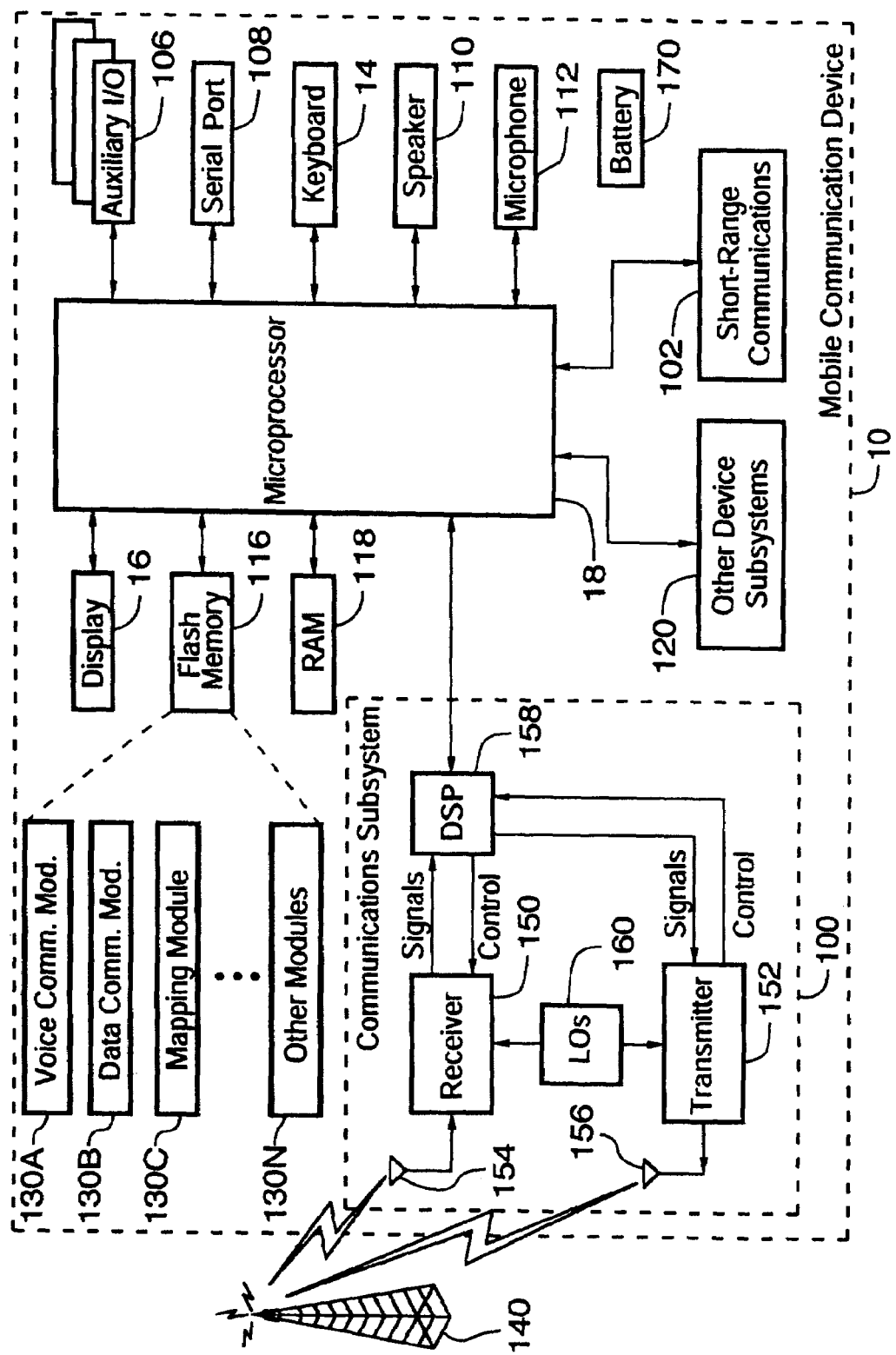
FIG. 2 is a block diagram of internal elements of the device of FIG. 1.

Referring to FIG. 2, a processing device (a microprocessor 18) is shown schematically as coupled between keyboard 14, display 16 and a series of other internal devices to device 10. The microprocessor 18 controls the operation of the display 16, as well as the overall operation of the device 10, in response to actuation of keys on the keyboard 14 or thumbwheel 14B by a user. Exemplary microprocessors for microprocessor 18 include Data 950™ series microprocessors and the 6200 series microprocessor, both available from Intel Corporation.

In addition to the microprocessor 18, other internal devices of the device 10 are shown schematically in FIG. 2. These devices include: a communication subsystem 100, a short-range communication subsystem 102, a set of auxiliary I/O devices 106, a serial port 108, a speaker 110 and a microphone 112. Memory for device 10 is provided in flash memory 116 and Random Access Memory (RAM) 118. Internal devices are enclosed within housing 12 and typically are either mounted onto a printed circuit board (PCB), affixed to an interior part of the housing or suspended by some means within housing 12.

The device 10 is preferably a two-way radio frequency (RF) communication device having voice and data communication capabilities. In addition, device 10 preferably has the capability to communicate with other computer systems via the Internet.

Operating system software executed by the microprocessor 18 is preferably stored in a computer readable medium, such as flash memory 116, but may be stored in other types of memory devices, such as read only memory (ROM) or similar storage element. In addition, system software, specific device applications, or parts thereof, may be temporarily loaded into a volatile store, such as RAM 118. Communication signals received by the mobile device may also be stored to RAM 118.

Microprocessor 18, in addition to its operating system functions, enables execution of software applications on device 10. A set of software applications that control basic device operations, such as a voice communication module 130A and a data communication module 130B, may be installed on the device 10 during manufacture or downloaded thereafter. Cell mapping module 130C may also be installed on device 10 during manufacture. As well, additional software modules, illustrated as an other software module 130N, which may be, for instance, a personal information manager (PIM) application, may be installed during manufacture or downloaded thereafter into device 10. PIM application is preferably capable of organizing and managing data items, such as e-mail messages, calendar events, voice mail messages, appointments, and task items. PIM application is also preferably capable of sending and receiving data items via a wireless network 140.

Communication functions, including data and voice communications, are performed through the communication subsystem 100, and possibly through the short-range communication subsystem 102. Communication subsystem 100 includes receiver 150, transmitter 152 and one or more antennae, illustrated as receive antenna 154 and transmit antenna 156. In addition, communication subsystem 100 also includes processing module, such as digital signal processor (DSP) 158 and local oscillators (LOs) 160. The specific design and implementation of communication subsystem 100 is dependent upon the communication network in which device 10 is intended to operate. For example, communication subsystem 100 of the device 10 may be designed to operate with the Mobitex™, DataTAC™ or General Packet Radio Service (GPRS) mobile data communication networks and also designed to operate with any of a variety of voice communication networks, such as Advanced Mobile Phone Service (AMPS), Time Division Multiple Access (TDMA), Code Division Multiple Access CDMA, Personal Communication Service (PCS), Global System for Mobile Communication (GSM), etc. Other types of data and voice networks, both separate and integrated, may also be utilized with device 10. It will be appreciated that some signals received and transmitted through the subsystem 100 may provide interfering signals with other components in device 10, such as microphone 112.

Network access requirements vary depending upon the type of communication system which can communicate with device 10. For example, in the Mobitex™ and DataTAC™ networks, mobile devices are registered on the network using a unique Personal Identification Number (PIN) associated with each device. In GPRS networks, however, network access is associated with a subscriber or user of a device. A GPRS device therefore requires a subscriber identity module, commonly referred to as a Subscriber Identity Module (SIM) card, in order to operate on a GPRS network.

When required network registration or activation procedures have been completed, device 10 may send and receive communication signals over communication network 140. Signals received from communication network 140 by the receive antenna 154 are routed to receiver 150, which provides for signal amplification, frequency down conversion, filtering, channel selection, etc., and may also provide analog to digital conversion. Analog-to-digital conversion of received signals allows the DSP 158 to perform more complex communication functions, such as signal demodulation and decoding. In a similar manner, signals to be transmitted to network 140 are processed (e.g., modulated and encoded) by DSP 158 and are then provided to transmitter 152 for digital to analog conversion, frequency up conversion, filtering, amplification and transmission to communication network 140 (or networks) via the transmit antenna 156.

In addition to processing communication signals, DSP 158 provides for control of receiver 150 and transmitter 152. For example, gains applied to communication signals in receiver 150 and transmitter 152 may be adaptively controlled through automatic gain control algorithms implemented in DSP 158.

In a data communication mode, a received signal, such as a text message or web page download, is processed by the communication subsystem 100 and is input to microprocessor 18. The received signal is then further processed by microprocessor 18 for an output to the display 16, or alternatively to some other auxiliary I/O devices 106. A device user may also compose data items, such as e-mail messages, using keyboard (keypad) 14, and/or some other auxiliary I/O device 106, such as a touchpad, a thumbwheel, a rocker switch or some other type of input device. The composed data items may then be transmitted over communication network 140 via communication subsystem 100.

In a voice communication mode, overall operation of device 10 is substantially similar to the data communication mode, except that received signals are output to speaker 110, and received audio signals are provided to microphone 112 for further conversion into an electrical signal and further processing by device 10. Microphone 112 is preferably a silicon-based transducer which can be mounted to PCB 302 (shown in FIG. 3).

Short-range communication subsystem 102 enables communication between device 10 and other proximate systems or devices, which need not necessarily be similar devices. For example, the short-range communication subsystem may include an infrared device and associated circuits and components, or a Bluetooth™ communication module to provide for communication with similarly-enabled systems and devices.

Powering the entire electronics of the mobile handheld communication device is power source 170. Preferably, the power source 170 includes one or more batteries. More preferably, the power source 170 is a single battery pack, especially a rechargeable battery pack. Power switch 172 provides a separate on/off switch for device 10.

Figure 3:
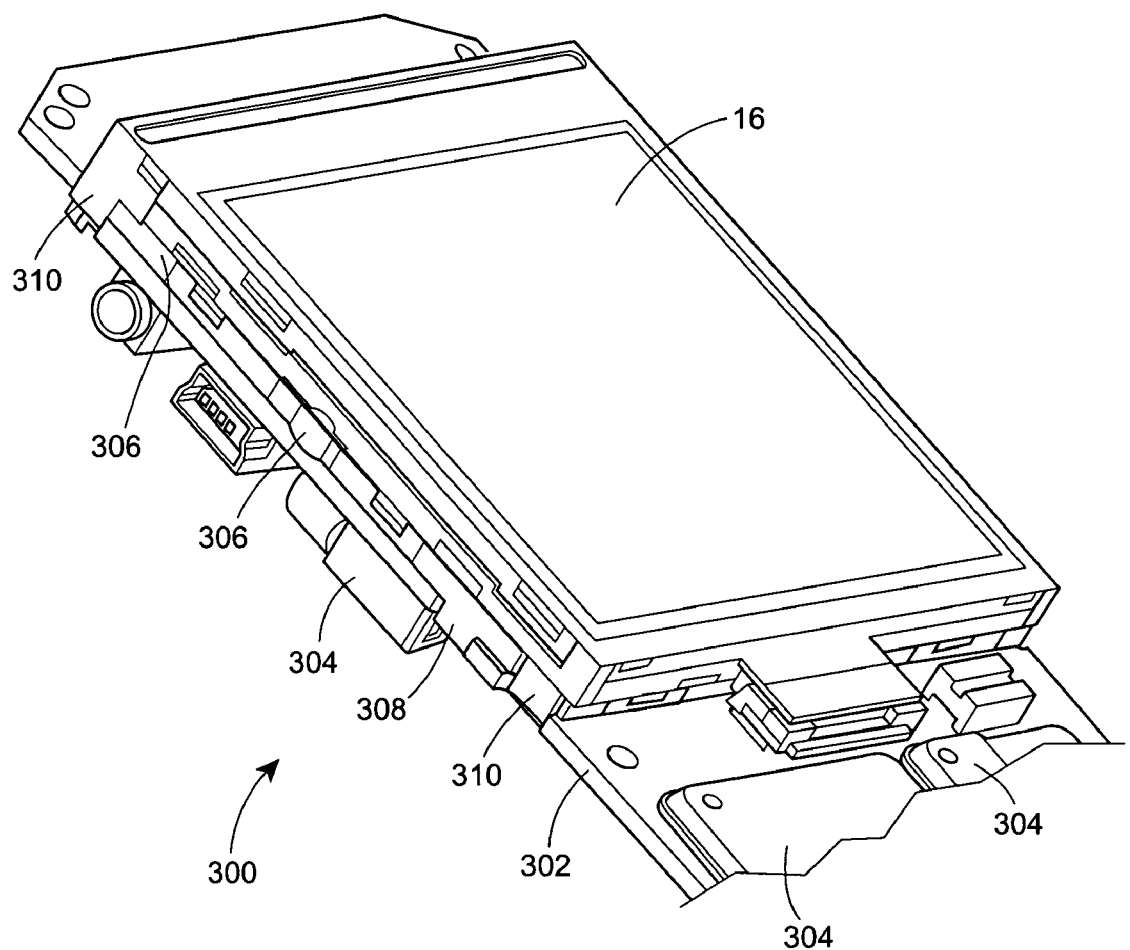
FIG. 3 is a top perspective view of a portion of an assembled and populated PCB, a display and the display frame of the device of FIG. 1.

Referring to FIGS. 1 and 3, further detail on aspects of housing 12 and internal devices of device 10 are shown. First, PCB 302 provides a substrate for mounting and supporting the internal surface devices on both of its upper and bottom sides and provides some electrical circuitry for the devices, as defined by etchings within the layers of plastic and copper. As such, devices can be more densely packed thereon, thereby reducing the size of PCB 302. PCB 302 is securely mountable within housing 12, typically via screws which are threaded through mounting holes in PCB 302 into receiving threaded ports in the interior of housing 12. Alternatively, it may be snap fit to housing 12 with appropriate snap-fit tangs extending from PCB 302 to corresponding mounting locations in housing 12. PCB 302 is a generally planar sandwich of layers of plastic (or FR4) and copper.

Referring to FIG. 3, further detail is shown on internal elements of device 10. In particular, view 300 shows PCB 302 shown in perspective view having components mounted thereon collectively indicated as components 304. Such components 304 include the physical devices embodying elements of the modules described in FIG. 2. Components 304 are located on the top side and bottom side of PCB 302. Display 16 is a generally oblong and relatively thin vertical height and is fixedly attached to PCB 302 with a spaced relationship defined between the upper surface of PCB 302 and the bottom surface of display 16. Display frame 306 is mounted between display 16 and PCB 302, providing the spaced relationship to PCB 302. As shown, display frame 306 is fixedly mounted to PCB 302 via posts, provided as snap-hooks 308. Display 16 mounts on top of display frame 306 and also snap fits to PCB 302 via another set of posts, provided as snap-hooks 310.

Figure 4:
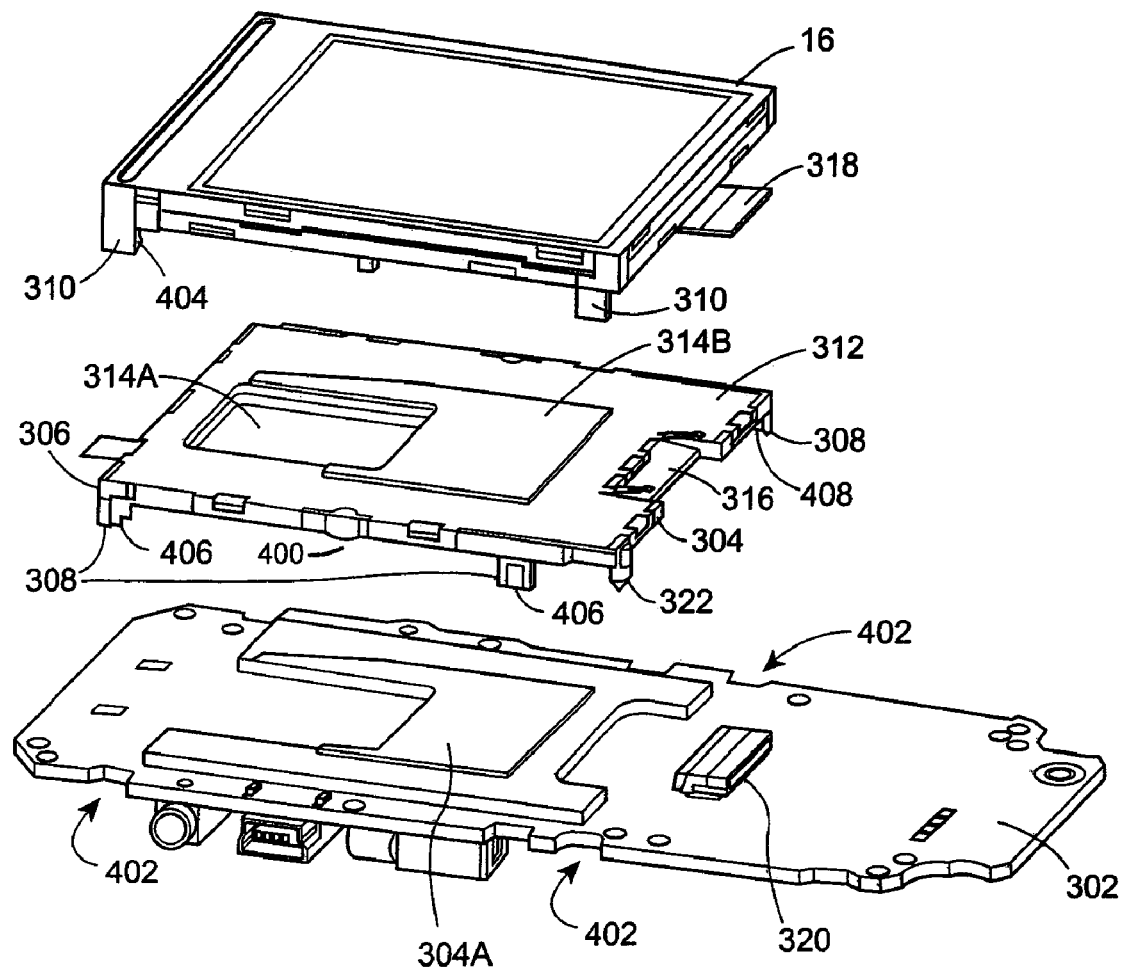
FIG. 4 is a top exploded perspective view of the PCB, the display and the display frame of FIG. 3.
Figure 5A:
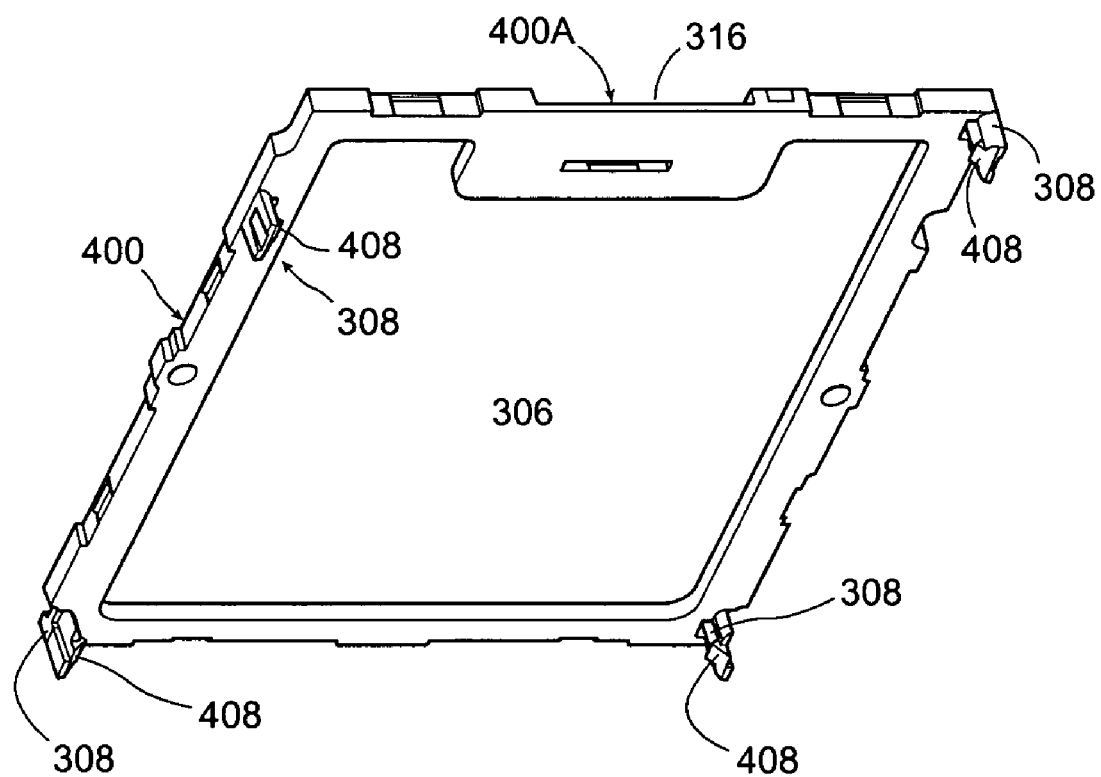
FIG. 5A is a bottom perspective view of a central portion of the display frame of FIG. 3.
Figure 5B:
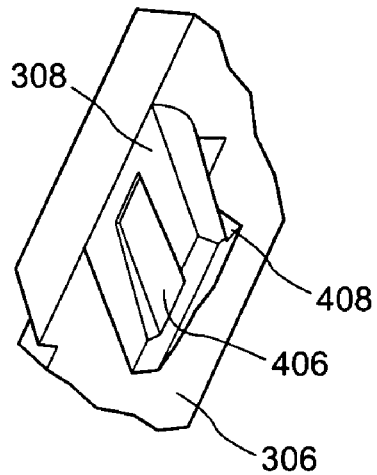
FIGS. 5B-5E are bottom perspective views of portions of the display frame of FIG. 3.
Figure 5C:
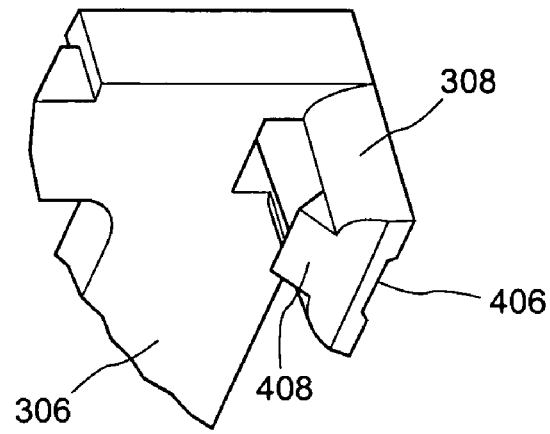
Figure 5D:
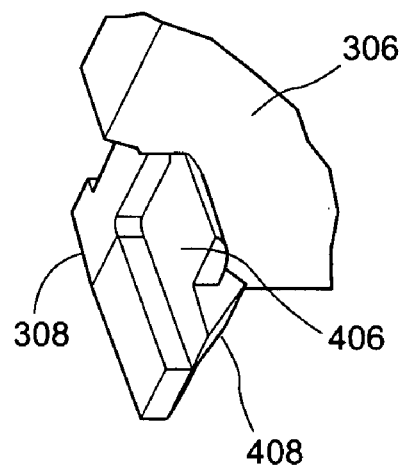
Figure 5E:
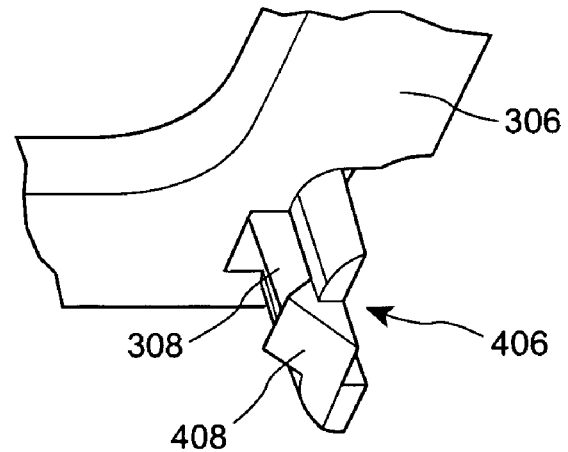

Referring to FIG. 4, further detail on the space relationship amongst display 16, frame 306 and PCB 302 is provided. As is shown, on PCB 302, component 304A are directly underneath frame 306. Frame 306 is shaped to allow component 304A to be located on PCB 302 within a region underneath frame 306 and allows display 16 to be mounted above component 304A. The major components of frame 306 are a set of four generally oblong bars 400 arranged to define a flat, generally oblong frame. As such, frame 306 defines an internal cavity (not shown) whose exterior boundaries are generally defined by bars 400. Frame 306 also has cover 312 attached to the top surface of frame 306. In the embodiment, cover 312 is made of a heat and electrically conductive material, such as metal. While cover 312 is generally flat, it has surface features including depressed region 314A and raised region 314B. Regions 314A and 314B are shaped and contoured to complement shapes and contours of features (such as component 16B, FIG. 6) present on the bottom side of display 16 and shapes and contours formed by components 304A. As such, component 16B (FIG. 6) in the bottom side of display 16 jut into depressed region 314A and component 304A jut into raised region 314B. As such the bottom side of display 16 sits generally flush against cover 312, while providing sufficient minimal clearance between the bottom of display 16 and the top of components 304A. When display 16 is mounted to frame 306 and both frame 306 and display 16 are mounted to PCB 302, frame 306 lies flat against PCB 302 and display 16 lies flat against frame 306.

It is notable that frame 306 is shaped and positioned such that within its interior space, components 304A take up a portion of the space and depressed region 314A is shaped to descend from a top surface of frame 306 and is shaped to fit in a region which does not overlap with components 304A. As such, display 16 can be placed closer to PCB 302, with the height of frame 306 selected accordingly, in contrast to a situation where depressed region 314A is located above components 304A.

It will be appreciated that frame 306 when mounted to PCB 302 provides structural rigidity to PCB 302.

Referring to FIG. 4, FIGS. 5A-E and FIG. 6, in the embodiment, frame 306 is mounted to PCB 302 via a friction fit arrangement. In particular, snap hooks 308 are located in each corner of frame 306 and extend vertically downward from its corner. Each snap hook 308 has a horizontally extending hook 408 at its bottom. In PCB 302, for each snap hook 308, there is a corresponding notch 402 in PCB 302 allowing at least a portion of the corresponding snap hook 308 to engage a side and bottom of PCB 302. It will be appreciated that in other embodiments, the location and number of snap hooks 308 and notches 402 can be modified to suit dimensions of the environment.

In the embodiment, display 16 is mounted about frame 306 to PCB 302 via a friction fit arrangement. In particular, snap hooks 310 are located about each corner of display 16 at a location which allows it to engage a part of snap hook 308 on frame 306. Each snap hook 310 extends vertically downward from its corner and has an inward horizontally extending hook 404 at its bottom. For each snap hook 310, there is a corresponding notch 406 in snap hook 308 allowing a portion of snap hook 310 to mate against a side of the corresponding snap hook 308. Further the snap hook 310 is sized to extend downward below frame 306 such that its hook 404 can either a notch in snap hook 308, a side and bottom of PCB 302 or both snap hook 308 and PCB 302. It will be appreciated that in other embodiments, the location, shape and number of snap hooks 310 and notches 406 can be modified as required using techniques known in the art. Posts 322 in frame 306 are located at spaced positions on the bottom of frame 306 and extend downward. For each post 322, there is a mating opening in PCB 302, thereby providing an alignment mechanism for mating frame 306 to PCB 302. In another embodiment, a post 322 makes an electrical connection with an internal copper layer in PCB 302. In other embodiments, other fastening mechanisms may be used to secure frame 306 to PCB 302, including screws and binding posts, glue or other techniques known in the art.

Turning back to display 16, its electrical connector 318 is shown extending from a bottom side of an end of display 16. In use, connector 318 mates with connector 320 on PCB 302. Connector 320 has internal wires connected to copper traces on PCB 302, thereby providing electrical contact for control of display 16. As frame 306 is shaped to have approximately the same footprint of display 16 and as connector 318 extends from the bottom of display 16, notch 410 is provided in frame 306 at a region where connector 318 would extend downward from display 16, when display 16 is mounted to frame 306. Notch 410 is shaped to allow connector 318 access to connector 320 and allow display 16 to be mounted flat against frame 306.

Figure 6:
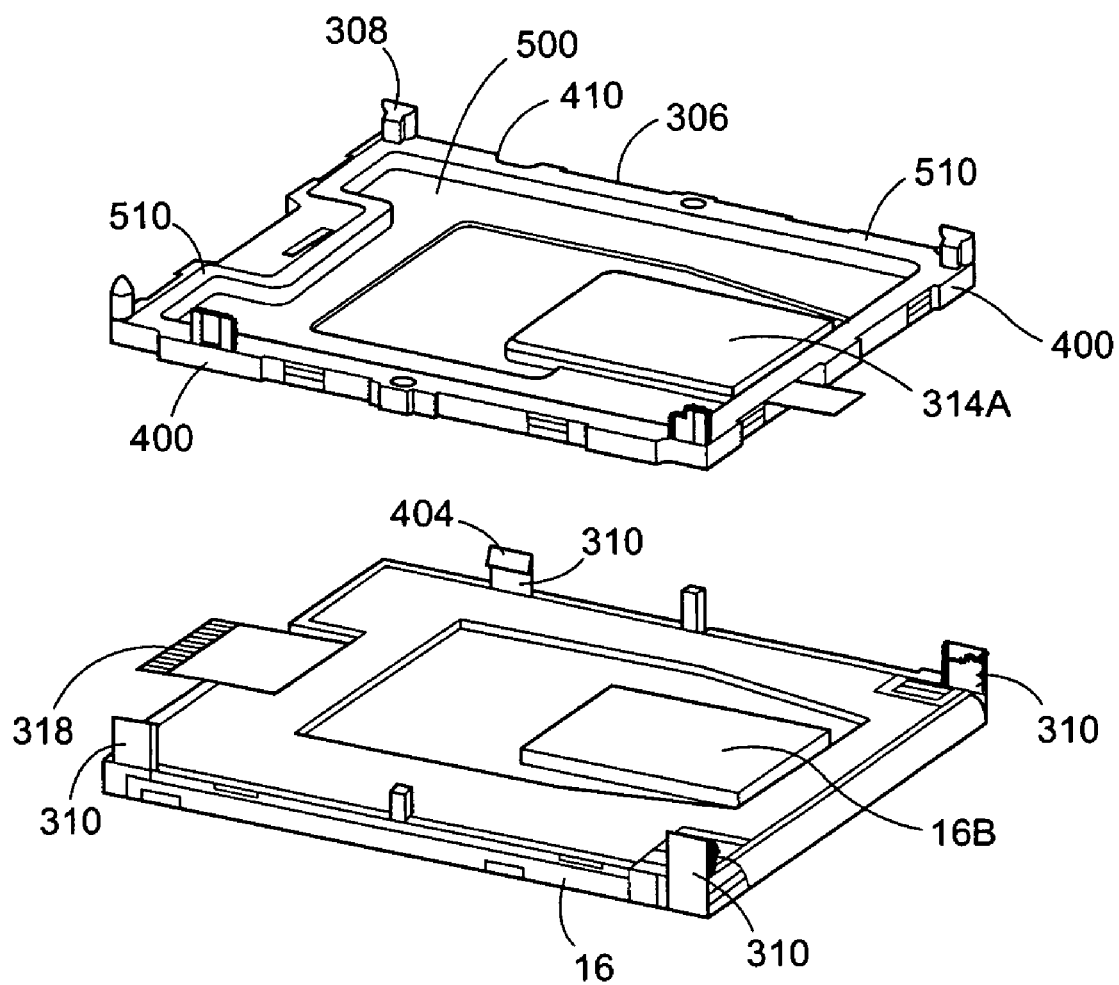
FIG. 6 is a bottom exploded perspective view of the display and the display frame of FIG. 3.
Figure 7:
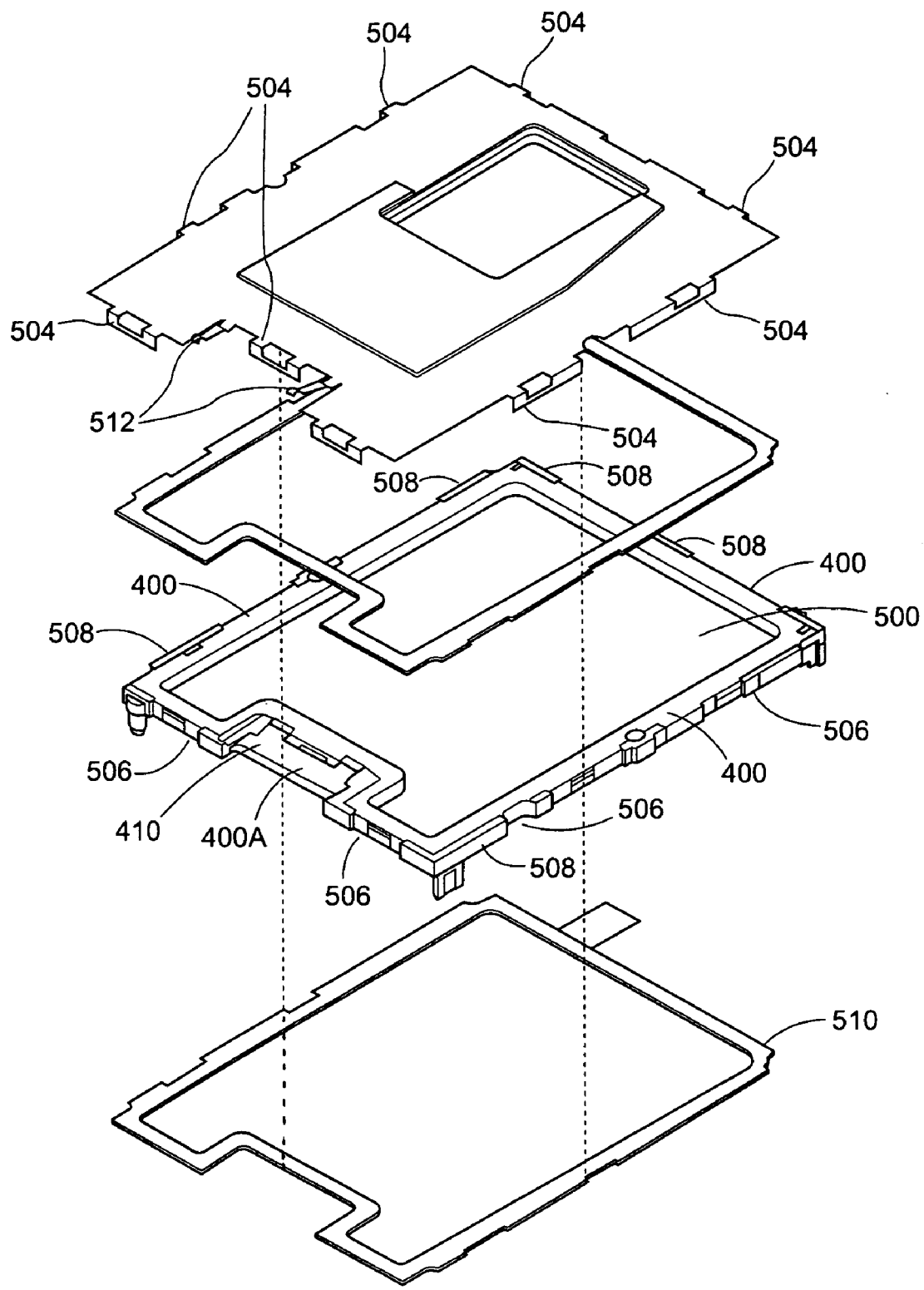
FIG. 7 is a top exploded perspective view of the display frame of FIG. 1 and aspects of its construction.

Referring to FIGS. 6 and 7, further detail is provided on aspects of frame 306 and display 16. Frame 306 has four bars 400 to define the exterior perimeter and interior cavity 500 associated with frame 306. Cover 312 is shaped to fit flush with the exterior dimensions of frame 306. Cover 312 is securely attached to frame 306. In the embodiment, adhesive strip 502 is a shaped doubled sided adhesive tap shaped to fit on the top surface of bars 400. As such, when cover 312 is placed on top of frame 306, adhesive strip 502 binds to both frame 306 and cover 312. Also, cover 312 has snap-fit tabs 504 which provide a friction fit mating arrangement with corresponding snap-regions 506 on frame 306. Each snap-region 506 is shaped to receive at least a portion of a side of its corresponding snap-fit tab 504. Further, rails 508 on bars 400 extend upwardly from the exterior sides of bars 400 and provide a set of alignment rails to assist in guiding the positioning of cover 312 as it is being place on frame 306.

Also, adhesive strip 510 is a shaped doubled sided adhesive tape shaped to fit on the bottom surface of bars 400. As such, when frame 306 is mounted to PCB 302, in addition to the snap-fit provided by snap hooks 308 gripping portions of PCB 302, strip 510 provides a further securement mechanism to fix frame 306 to PCB 302.

As noted, display 16 has connector 318 located on the bottom surface about one end thereof. As such, bar 400A has depression 316 formed therein to allow connector 318 to fit against frame 306.

The embodiment also provides enhanced electrical grounding for display 16. In particular, on cover 312, around either side of the corresponding opening around depression 316, flanges 512 extend vertically upward. Flanges 512 make friction contact with the bottom of display 16 when display 16 is mounted on cover 312 and are shaped and located on cover 312 such that the extended end of flanges 510 contact a grounded metal section on the bottom of display 16, thereby making an electrical connection between cover 312 and the bottom of display 16. In the embodiment, frame 306 is composed of a plastic material such as PVC or any suitable plastic material. In addition, frame 306 may have a metal plating which is in contact with cover 312. Also, frame 306 may contain metallic particles therein or may have metallic shunts or connections therein which contact cover 312. On the surface layer of PCB 302, electrical contact points may be provided which connect a ground plane in PCB 302 to any such shunts or connections or frame 306 itself. In the embodiment, adhesive strips 502 and 510 are conductive, thereby enhancing electrical contacts between frame 306 and PCB 302. As such, a direct electrical connection is provided from the bottom of display 16 to the ground plane of PCB 302.

Further still, the embodiment also provides electrical shielding from external RF signals for components located under frame 306, such as components 304A, on PCB 302. The electrical shielding is provided from an electrical cage formed from the electrical portion of the bottom of display 16 in contact with cover 312 in contact with adhesive strip 502 in contact with conductive portions of frame 306 in contact with adhesive strip 510 in contact with selected ground tracks in PCB 302. To facilitate electrical connections between frame 306 and cover 312, in one embodiment, frame 306 is covered with a metal plate and in another embodiment, it is metal plated.

It will be appreciated that in other embodiments, frame 306 may be replaced by a frame and bars having different shapes and sizes. For example, frame 306 and cover 312 may be formed as a single piece. Also, the other frame may be provided in two or more pieces. Also, the other frame may be one piece, which does not define a closed perimeter. Also, frame 306 may be replaced by a series of posts or similar singular structures.

It will be appreciated that although the embodiments have been shown being used with a communication device, such as a portable phone, it is possible to use any embodiment in any device having electrical components. Further, any embodiment may be used to provide a spaced relationship for any component to PCB, not necessarily just a display. It will be appreciated that the term frame may be used generically to describe a system comprising a frame (such as frame 306) with a cover (such as cover 312). In such use, the frame portion may be identified as a frame section of the frame.

Although the invention has been described with reference to certain specific embodiments, various modifications thereof will be apparent to those skilled in the art without departing from the scope of the invention as outlined in the claims appended hereto.

We claim:

1. A frame for mounting a device above a printed circuit board (PCB) in within a housing of an electronic device, said frame comprising:
   a frame section formed to be located on said PCB about a surface device on a surface of said PCB; and
   a cover for placement on top of said frame section and for providing a support substrate for said device, said cover having a raised region to allow a part of said surface mounted device to jut above said frame section and a depressed region to receive a feature on the bottom of said device to allow said feature to extend into an interior cavity bounded by said frame section,
   wherein
   said frame section is securable to said PCB such that at least a part of said surface device is surrounded by said frame section;
   said cover is locatable on said frame section with said device mounted to said cover; and
   said frame section and said cover are enclosed within said housing.

2. The frame for mounting said device above said PCB as claimed in claim 1, wherein:
   each of said cover and said frame section is comprised of an electrically conductive material such that said cover and said frame provide an electrical contact for said device to a ground plane on said PCB providing an electric shield to said surface device.

3. The frame for mounting said device above said PCB as claimed in claim 1, wherein:
   said device is a display device; and
   said cover has at least one electrically conductive flange extending upward to contact a bottom of said device.

4. The frame for mounting said device above said PCB as claimed in claim 3, wherein:
   said frame has a first post which interacts with said PCB to secure said frame to said PCB; and
   said cover has a second post which interacts with said first post to secure said cover to said frame.

5. The frame for mounting said device above said PCB as claimed in claim 4, wherein said feature extending from said bottom of said device is not located above said surface device.

6. The frame for mounting said device above said PCB as claimed in claim 1, wherein said frame section defines a closed perimeter for said interior.

7. The frame for mounting said device above said PCB as claimed in claim 3, wherein said frame section comprises at least one oblong section shaped to rest on said PCB.

8. The frame for mounting said device above said PCB as claimed in claim 4, wherein said second post interacts over said first post to secure said cover to said frame.

9. A printed circuit board (PCB) assembly for an electronic device, said assembly comprising:
   a PCB having a surface device mounted on a surface of said PCB;
   a frame section formed to be located on said PCB such that at least a part of said surface device is surrounded by said frame section;
   a cover located on top of said frame section, said cover shaped to allow a feature on the bottom of said device to extend into an interior cavity of said frame section, said interior cavity defined by said frame section and said cover having a raised region to allow a part of said surface mounted device to jut above said frame section; and
   a device mounted on said cover,
   wherein
     when said frame section is secured to said PCB about said surface device and said cover is located on said frame section and said device is mounted to said cover, said surface device is located at least partially underneath said cover; and
     said frame section, said PCB and said cover are for installation within a housing of said electronic device.

10. The PCB assembly as claimed in claim 9, wherein:
    each of said cover and said frame section is comprised of an electrically conductive material such that said cover and said frame provide an electrical contact for said device to a ground plane on said PCB.

11. The PCB assembly as claimed in claim 10, wherein:
    said device is a display device; and
    said cover has at least one electrically conductive flange extending upward to contact a bottom of said device.

12. The PCB assembly as claimed in claim 9, wherein:
    said frame section has a first post which interacts with said PCB to secure said frame to said PCB; and
    said cover has a second post which interacts with said first post to secure said cover to said frame section.

13. The PCB assembly as claimed in claim 12, wherein said feature extending from said bottom of said device is not located above said surface device.

14. The PCB assembly as claimed in claim 9, wherein said frame section defines a closed perimeter for said interior.

15. The PCB assembly as claimed in claim 9, wherein said frame section comprises at least one oblong section shaped to rest on said PCB.

16. The PCB assembly as claimed in claim 12, wherein said second post interacts with said first post over said first post to secure said cover to said frame section.

\* \* \* \* \*